US012520598B2

(12) United States Patent
Kao et al.

(10) Patent No.: US 12,520,598 B2
(45) Date of Patent: Jan. 6, 2026

(54) PROTECTION DIODE STRUCTURE FOR STACKED IMAGE SENSOR DEVICES

(71) Applicant: Taiwan Semiconductor Manufacturing Company, Ltd., Hsin-Chu (TW)

(72) Inventors: Min-Feng Kao, Chiayi (TW); Tzu-Hsuan Hsu, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 619 days.

(21) Appl. No.: 17/845,624

(22) Filed: Jun. 21, 2022

(65) Prior Publication Data

US 2023/0307437 A1    Sep. 28, 2023

Related U.S. Application Data

(60) Provisional application No. 63/322,519, filed on Mar. 22, 2022.

(51) Int. Cl.
*H10D 89/60* (2025.01)
*H01L 23/00* (2006.01)
*H10F 39/00* (2025.01)

(52) U.S. Cl.
CPC ........... *H10D 89/611* (2025.01); *H01L 24/08* (2013.01); *H01L 24/80* (2013.01); *H10F 39/018* (2025.01);
(Continued)

(58) Field of Classification Search
CPC ....... H10D 89/611; H01L 24/08; H01L 24/80; H01L 2224/08145; H01L 2224/80895;
(Continued)

(56) References Cited

U.S. PATENT DOCUMENTS 7,564,115 B2    7/2009   Chen et al.
7,633,165 B2    12/2009  Hsu et al.
(Continued)

FOREIGN PATENT DOCUMENTS

JP    2005268379 A    9/2005
KR    20120089691 A   8/2012
(Continued)

*Primary Examiner* — Steven B Gauthier
*Assistant Examiner* — Alvin L Lee
(74) *Attorney, Agent, or Firm* — HAYNES AND BOONE, LLP

(57) ABSTRACT

A first side of a sensor wafer is bonded to a first side of a first logic wafer. The sensor wafer contains pixels configured to detect radiation that enters the sensor wafer through a second side of the sensor wafer opposite the first side. The first logic wafer contains circuitry configured to operate the pixels. The sensor wafer or the first logic wafer contains a protection diode. The first logic wafer is thinned from a second side of the first logic wafer opposite the first side. A through-substrate-via (TSV) is formed in the first logic wafer. The protection diode protects the sensor wafer or the first logic wafer from being damaged during the forming of the TSV. The second side of the first logic wafer is bonded to a second logic wafer. The sensor wafer is thinned from the second side of the sensor wafer.

20 Claims, 12 Drawing Sheets

(52) U.S. Cl.
CPC ......... *H10F 39/809* (2025.01); *H10F 39/811* (2025.01); *H01L 2224/08145* (2013.01); *H01L 2224/80895* (2013.01); *H01L 2224/80896* (2013.01); *H01L 2924/30201* (2013.01)

(58) Field of Classification Search
CPC . H01L 2224/80896; H01L 2924/30201; H10F 39/018; H10F 39/809; H10F 39/811; H10F 39/014; H10F 39/026; H10F 39/803
See application file for complete search history.

(56) References Cited

U.S. PATENT DOCUMENTS

| | | | |
|---|---|---|---|
| 7,825,024 | B2 | 11/2010 | Lin et al. |
| 7,838,424 | B2 | 11/2010 | Karta et al. |
| 7,863,742 | B2 | 1/2011 | Yu et al. |
| 7,932,601 | B2 | 4/2011 | Chang et al. |
| 7,973,413 | B2 | 7/2011 | Kuo et al. |
| 8,105,875 | B1 | 1/2012 | Hu et al. |
| 8,158,456 | B2 | 4/2012 | Chen et al. |
| 8,183,578 | B2 | 5/2012 | Wang |
| 8,183,579 | B2 | 5/2012 | Wang |
| 8,227,902 | B2 | 7/2012 | Kuo |
| 8,278,152 | B2 | 10/2012 | Liu et al. |
| 8,426,961 | B2 | 4/2013 | Shih et al. |
| 8,669,174 | B2 | 3/2014 | Wu et al. |
| 8,754,508 | B2 | 6/2014 | Chen et al. |
| 8,772,151 | B2 | 7/2014 | Chen |
| 8,802,504 | B1 | 8/2014 | Hou et al. |
| 8,803,292 | B2 | 8/2014 | Chen et al. |
| 8,803,316 | B2 | 8/2014 | Lin et al. |
| 8,846,548 | B2 | 9/2014 | Tu et al. |
| 2008/0225133 | A1 | 9/2008 | Takayanagi |
| 2013/0075856 | A1 | 3/2013 | Tsai |
| 2013/0153916 | A1 | 6/2013 | Weyers |
| 2013/0341800 | A1 | 12/2013 | Tu et al. |
| 2014/0001645 | A1 | 1/2014 | Lin et al. |
| 2014/0015122 | A1 | 1/2014 | Chou et al. |
| 2014/0045379 | A1 | 2/2014 | Chen |
| 2014/0048926 | A1 | 2/2014 | Wang et al. |
| 2014/0077356 | A1 | 3/2014 | Chen et al. |
| 2014/0183693 | A1 | 7/2014 | Tsai et al. |
| 2014/0187103 | A1 | 7/2014 | Chen et al. |
| 2014/0225258 | A1 | 8/2014 | Chiu et al. |
| 2014/0252558 | A1 | 9/2014 | Yu et al. |
| 2014/0252572 | A1 | 9/2014 | Hou et al. |
| 2014/0252597 | A1 | 9/2014 | Tsai et al. |
| 2014/0252601 | A1 | 9/2014 | Lu et al. |
| 2014/0252608 | A1 | 9/2014 | Chen et al. |
| 2014/0262468 | A1 | 9/2014 | Chen et al. |
| 2014/0264885 | A1 | 9/2014 | Tsai et al. |
| 2018/0240797 | A1 | 8/2018 | Yokoyama |
| 2021/0375966 | A1* | 12/2021 | Baba .................... H10F 39/8037 |
| 2022/0020788 | A1* | 1/2022 | Park ........................ H10F 39/18 |

FOREIGN PATENT DOCUMENTS

| | | |
|---|---|---|
| KR | 20190131485 A | 11/2019 |
| KR | 20200031203 A | 3/2020 |
| TW | 200933915 A | 8/2009 |

\* cited by examiner

PROTECTION DIODE STRUCTURE FOR STACKED IMAGE SENSOR DEVICES

PRIORITY DATA

The present application is a U.S. Utility application of U.S. Provisional Application 63/322,519, filed on Mar. 22, 2022, and entitled "Novel Structure For Stacked CIS Performance Improvement", the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As semiconductor devices shrink in size but increase in sophistication, they can be deployed in a great variety of applications. These applications may include semiconductor image sensors, which are used to sense radiation such as light. For example, complementary metal-oxide-semiconductor (CMOS) image sensors (CIS) and charge-coupled device (CCD) sensors are widely used in various applications such as digital still camera, mobile phones, medical devices, automobile sensors, etc. These devices utilize an array of pixels located in a substrate, including photodiodes and transistors, that can absorb radiation projected toward the substrate and convert the sensed radiation into electrical signals.

However, conventional image sensor device fabrication processes may expose the devices to ambient plasma, which may damage elements of the image sensor device. Furthermore, when conventional image sensor devices are in actual operation, it may also be susceptible to damage. Conventional methods of protecting the image sensor device from these types of damages have not been entirely satisfactory.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
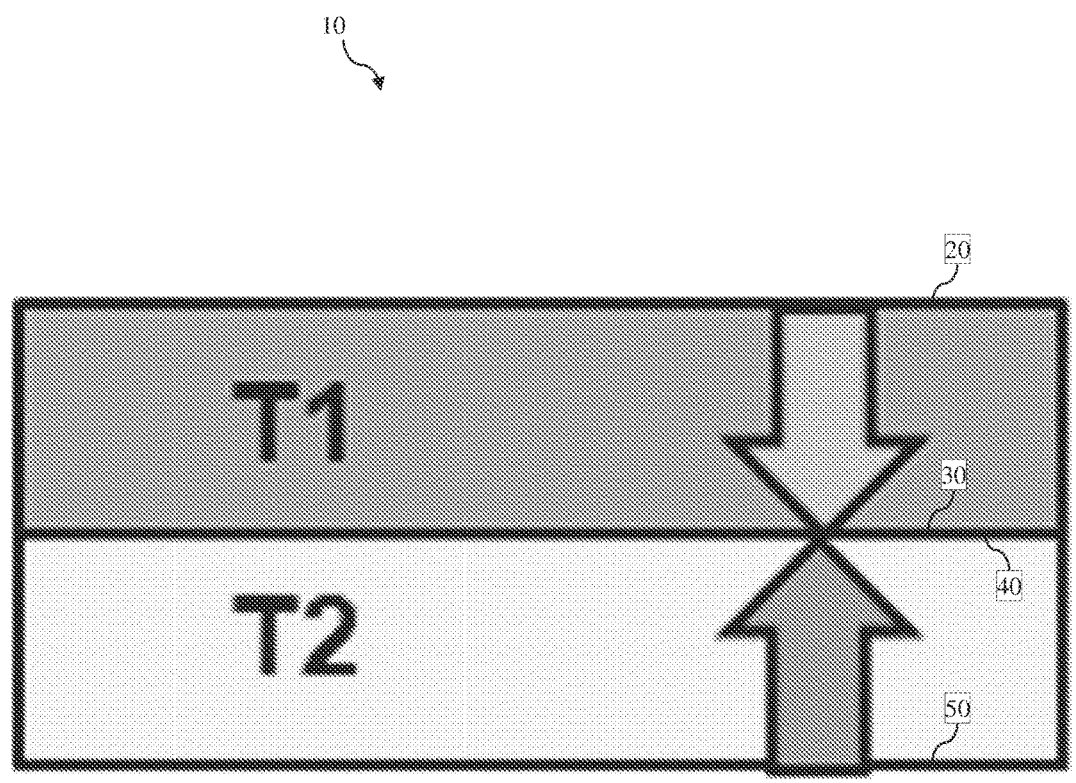
FIGS. 1-4 illustrate a series of cross-sectional side views of an image sensor device at various stages of fabrication corresponding to a process flow according to various aspects of the present disclosure.
Figure 1:
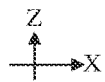

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to image sensor devices. For example, the present disclosure introduces methods and devices to protect a stacked CMOS image sensor (CIS) during its fabrication and operation, which in turn improves the yield and/or performance of the CIS. In more detail, an embodiment of a CIS 10 utilizes a 3-wafer stacked structure implementation. A simplified fabrication process flow of the CIS 10 is illustrated with reference to FIGS. 1-4, which are cross-sectional sides views of the CIS 10 at different stages of fabrication. The cross-sectional views are taken along a plane defined by a horizontal X-direction (or X-axis) and a vertical Y-direction (or Y-axis).

Referring now to FIG. 1, the CIS 10 includes a sensor wafer T1. The sensor wafer T1 may include a substrate, for example, a silicon substrate doped either with a P-type dopant or with an N-type dopant. The P-type dopant may be boron, and the N-type dopant may be phosphorous or arsenic. The substrate of the sensor wafer T1 may also include other elementary semiconductors such as germanium, and/or it may optionally include a compound semiconductor and/or an alloy semiconductor. Further, the substrate of the sensor wafer T1 may include an epitaxial layer (epi layer), may be strained for performance enhancement, and may include a silicon-on-insulator (SOI) structure.

The substrate of the sensor wafer T1 includes a plurality of radiation-sensing elements or light-sensing elements (not specifically illustrated in FIGS. 1-4 for reasons of simplicity). The radiation-sensing elements are parts of pixels operable to sense or detect radiation waves (e.g., light) projected toward the sensor wafer T1 and enters the sensor wafer T1 through a back side 20 of the sensor wafer T1. In some embodiment, the radiation-sensing elements include photodiodes. In other embodiments, the radiation-sensing elements may include pinned photodiodes (PPD), photogates, or other suitable photo-sensitive elements. The photodiodes or other types of radiation-sensing elements may be formed by performing a plurality of ion implantation processes on the substrate of the sensor wafer T1. For example, N+ implants, array-N-well implants, and deep-array-N-well implants may be performed. The ion implantation processes may include multiple implant steps and may use different types of dopants, implant dosages, and implantation energies. The ion implantation processes may also use different masks that have different patterns and opening sizes. In some embodiments, the radiation-sensing elements may also be formed in a doped well having an opposite type of conductivity as the substrate of the sensor wafer T1.

The radiation-sensing elements are physically and electrically separated by isolation structures, for example by shallow trench isolation (STI) or deep trench isolation (DTI) structures. The STI or DTI structures are formed by etching openings (or trenches) in the substrate and thereafter filling the openings with a suitable material. The isolation structures serve to prevent or substantially reduce cross-talk between adjacent radiation-sensing elements. The cross-talk may be electrical, or optical, or both. If left unabated, the cross-talk would have degraded the performance of the CIS 10.

The sensor wafer T1 may also include other types of microelectronic components, such as reset transistors, source follower transistors, transfer transistors, or other suitable devices. As will be discussed in greater detail below with reference to FIGS. 1-10, some of these microelectronic components may be electrically coupled to a protective device, such as a protection diode. For example, a transfer gate of the sensor wafer T1 may be electrically coupled to the protection diode, the details of which will be discussed below.

Still referring to FIG. 1, the sensor wafer T1 is bonded to a logic wafer T2. Specifically, a front side 30 of the sensor wafer T1 (which is opposite the back side 20) is bonded to a side 40 of the logic wafer T2. The logic wafer T2 contains different microelectronic components than the sensor wafer T1. For example, the logic wafer T2 does not contain the radiation-sensing elements such as photodiodes. Instead, the logic wafer T2 may include electrical circuitry configured to operate the pixels of the sensor wafer T1. For example, the logic wafer T2 may include decoders, registers, multiplexers/de-multiplexers, amplifiers, read-out transistors, reference pixels, application specific integrated circuit (ASIC), etc. These types of circuitry are located at or near the side 40, which may be referred to as an active side of the logic wafer T2.

The sensor wafer T1 and the logic wafer T2 each include an interconnect structure, respectively. The interconnect structure includes a plurality of patterned dielectric layers and conductive layers that provide interconnections (e.g., metal wiring) between the various doped features, circuitry, and input/output of the CIS 10. In some embodiments, the interconnect structure may be a multilayer interconnect (MLI) structure that includes a plurality of metal layers (e.g., metal-0, metal-1, metal-2, etc.) formed in a configuration such that an interlayer dielectric (ILD) separates and isolates the contacts, vias and metal lines of the MLI structure. In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes. It is understood that other conductive materials such as cobalt, tungsten, or ruthenium may also be used to form the various components of the MLI structure.

In the embodiment shown in FIG. 1, the interconnect structure of the sensor wafer T1 is located at the front side 30 of the sensor wafer T1, and the interconnect structure of the logic wafer T2 is located at the side 40 of the logic wafer T2. As such, the interconnect structure of the sensor wafer T1 is bonded to the interconnect structure of the logic wafer T2. In some embodiments, the sensor wafer T1 includes a hydrophobic bonding layer (HBL) at the back side 30, and the logic wafer T2 includes an HBL at the side 40, and the bonding of the sensor wafer T1 and the logic wafer T2 is made at least in part through their respective HBLs.

Figure 2:
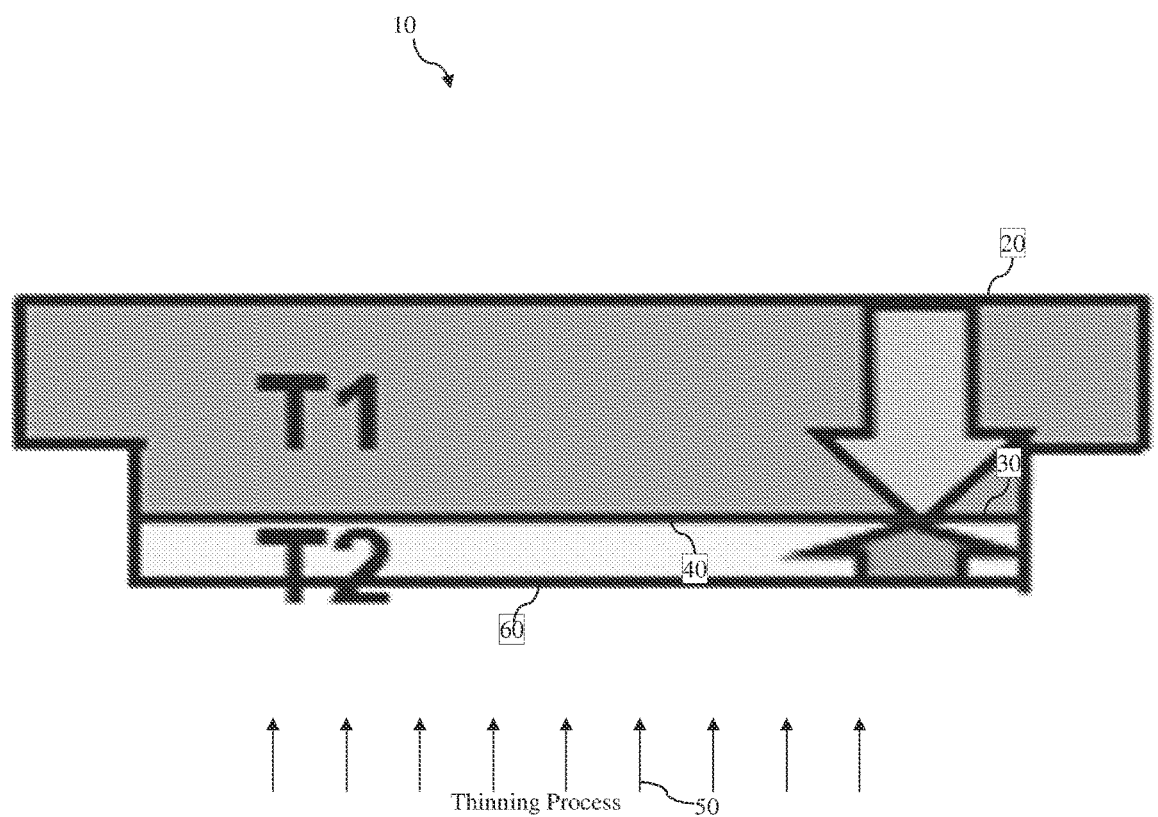

Referring now to FIG. 2, a thinning process 50 is performed to the logic wafer T2 from a side 60 of the logic wafer T2 opposite the side 40. The side 60 may also be referred to as a back side of the logic wafer T2, whereas the side 40 may also be referred to as a front side of the logic wafer T2. In some embodiments, the thinning process 50 may include a mechanical grinding process and/or a chemical thinning process. For example, a substantial amount of material may be first removed from the side 60 of the logic wafer T2 during the mechanical grinding process. Afterwards, the chemical thinning process may apply an etching chemical to the logic wafer T2 to further thin the logic wafer T2. In some embodiments, the thinning process 50 may reduce the logic wafer T2 from an initial thickness of between about 700~800 microns down to a thickness of between about 2~3 microns.

After the thinning process 50 is performed, a through-substrate-via (TSV, also referred to as a through-silicon-via) is formed in the logic wafer T2. The formation of such a TSV includes one or more etching, deposition, or ashing processes, which may use plasma. The charges from the plasma may cause unintentional damage to the metallization features (e.g., metal lines or vias/contacts) on the logic wafer T2, which would be undesirable. To alleviate this problem, the present disclosure implements one or more protection diodes in the logic wafer T2 and/or in the sensor wafer T1. As will be discussed below in more detail, the protection diode includes multiple doped regions that help release or otherwise dissipate the plasma charges associated with the etching or metal deposition processes used to form the TSV, which is one of the benefits offered by the present disclosure. It is also understood that an HBL may be formed at the side 60 of the logic wafer T2 after the thinning process 50 is performed. For reasons of simplicity, the HBL, the TSV, and the protection diode are not specifically illustrated in FIG. 2, though they will be illustrated and discussed in greater detail in later figures, such as in FIGS. 5-6.

Figure 3:
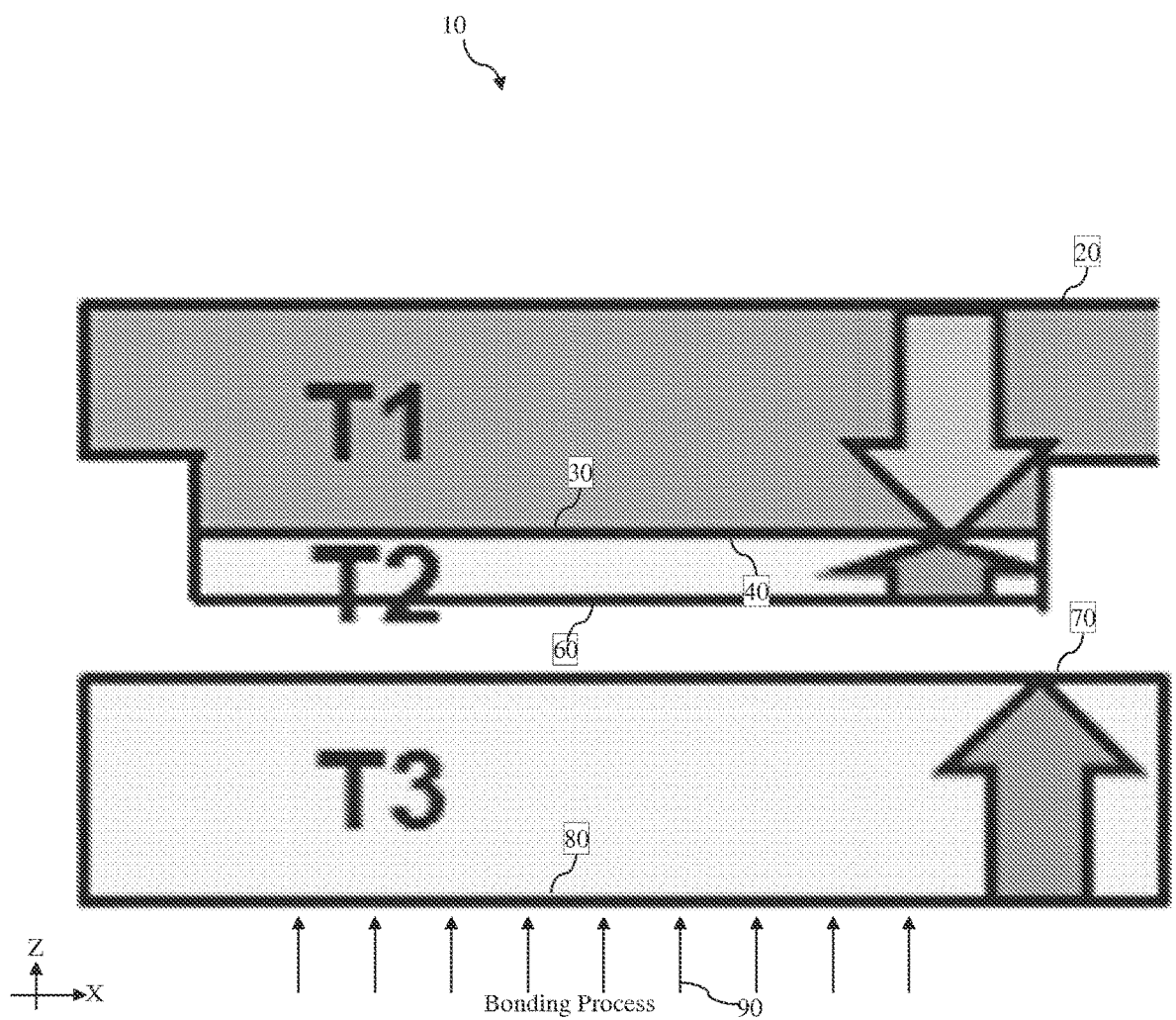

Referring now to FIG. 3, another logic wafer T3 is provided. Similar to the logic wafer 2, the logic wafer T3 may contain different microelectronic components than the sensor wafer T1. For example, the logic wafer T3 does not contain the radiation-sensing elements of the sensor T1 but instead contains circuitry for operating or otherwise electrically interacting with the radiation-sensing elements of the sensor wafer T1. The circuitry of the logic wafer T3 may mostly be formed at or near a side 70 of the logic wafer T3, which may be referred to as an active side of the logic wafer T3. The logic wafer T3 also has a side 80 opposite the side 70.

Still referring to FIG. 3, a bonding process 90 is performed to the CIS 10 to bond the side 70 of the logic wafer T3 to the side 60 of the logic wafer T2. In some embodiments, an HBL is formed on the logic wafer T2 at the side 60, and an HBL is formed on the logic wafer T3 at the side 70. The bonding may be performed at least in part by bonding these respective HBLs together.

Figure 4:
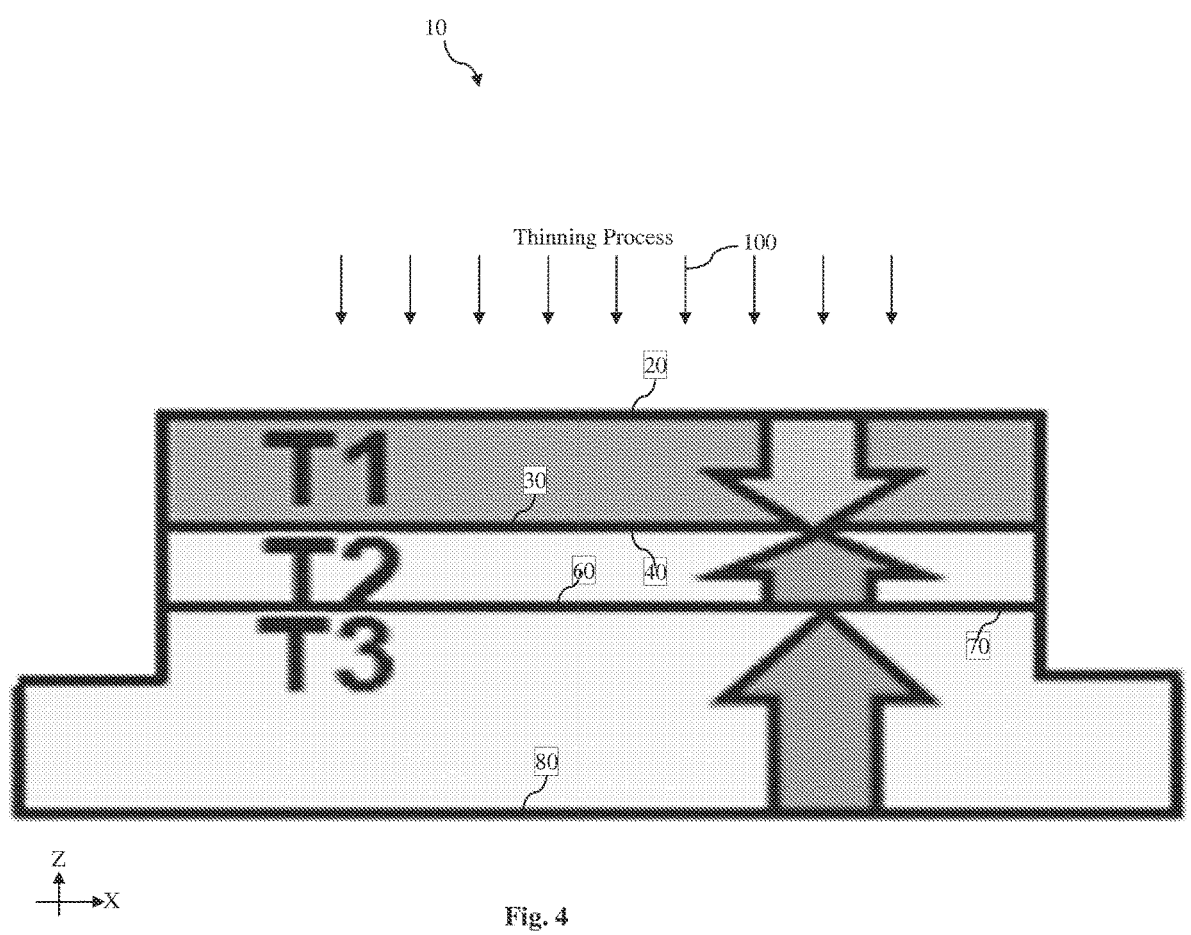

Referring now to FIG. 4, a thinning process 100 is performed to the CIS 10 to reduce a thickness of the sensor wafer T1. Again, the thinning process 100 may include a mechanical grinding process and/or a chemical thinning process. For example, a substantial amount of material may be first removed from the side 20 of the sensor wafer T1 during the mechanical grinding process. Afterwards, the chemical thinning process may apply an etching chemical to the sensor wafer T1 to further thin the sensor wafer T1. After the thinning process 100 is performed, openings may be formed on the side 20 of the sensor wafer T1 for the sensor elements. These openings may be for chip pads that are used for probing and/or testing of the CIS 10.

Figure 5:
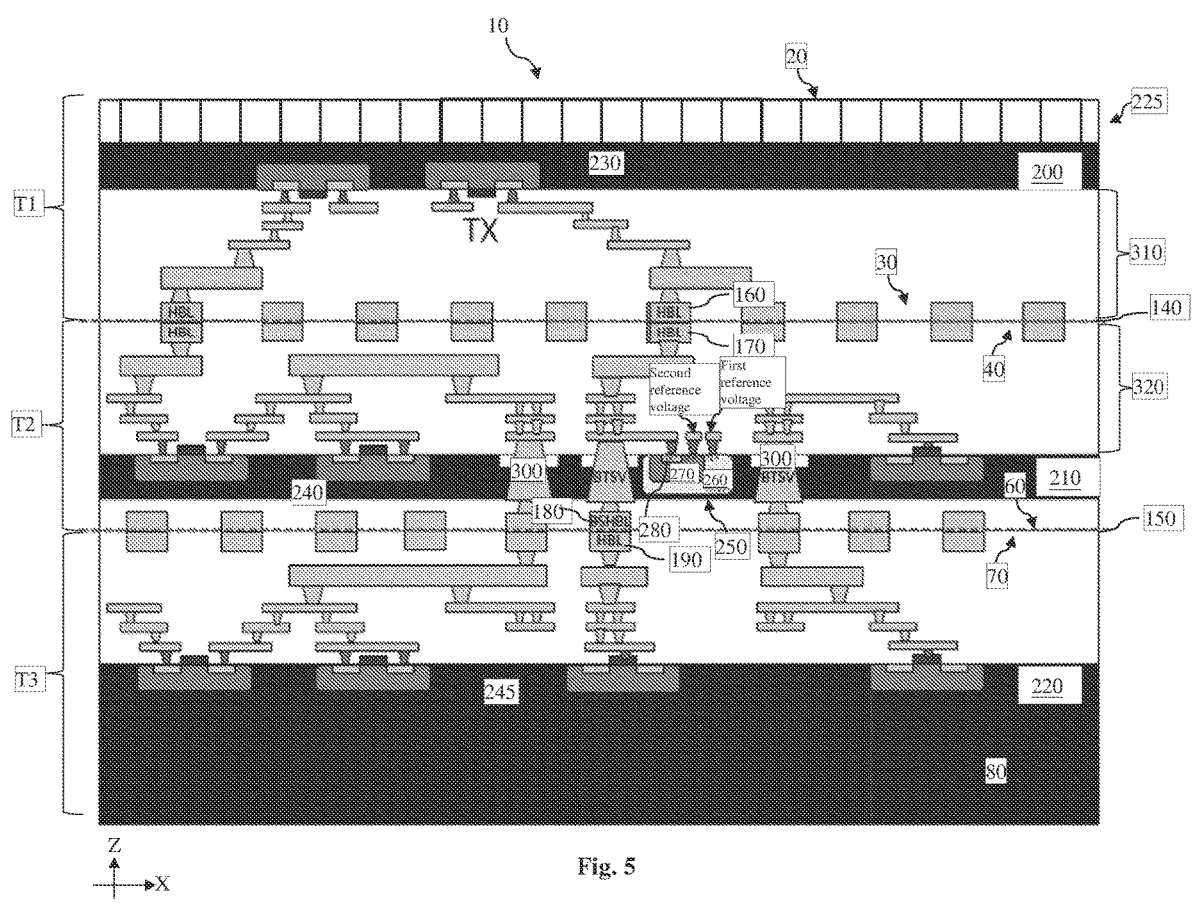
FIGS. 5-10 illustrate cross-sectional side views of an image sensor device according to various aspects of the present disclosure.
Figure 6:
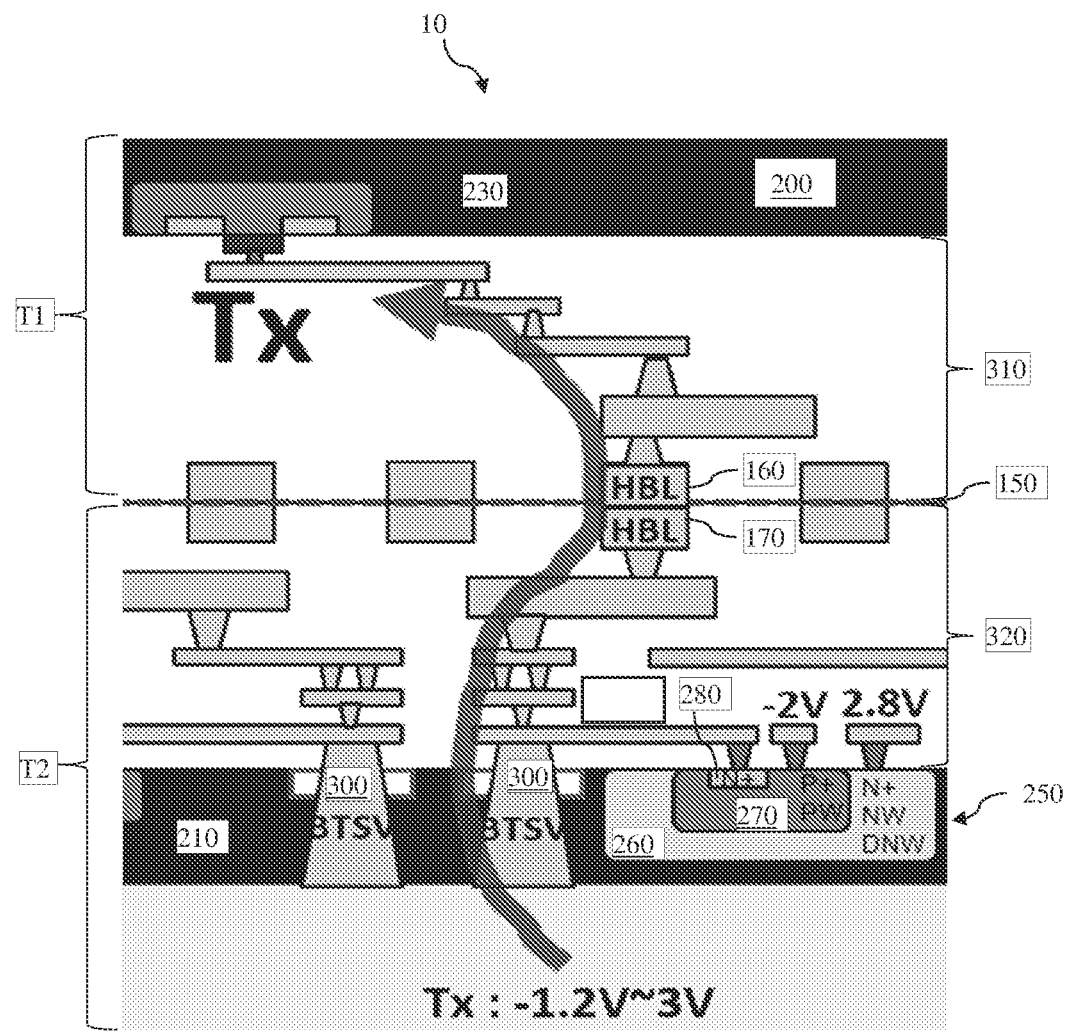

FIGS. 5-6 are diagrammatic fragmentary cross-sectional side views of the CIS 10 according to one embodiment of the present disclosure. In more detail, FIG. 5 illustrates the details of the CIS 10 as a stacked structure of three wafers that are bonded together: the sensor wafer T1, the logic wafer T2, and the logic wafer T3, and FIG. 6 illustrates a magnified view of a portion of the CIS 10. In other words, the CIS 10 of FIGS. 5-6 have already undergone the fabrication steps discussed above in association with FIGS. 1-4. For reasons of consistency and clarity, similar components appearing in FIGS. 1-6 are labeled the same.

Referring to FIGS. 5-6, the sensor wafer T1 is bonded to the logic wafer T2 through a bonding interface 140, and the logic wafer T2 is bonded to the logic wafer T3 through a bonding interface 150. For example, the sensor wafer T1 includes one or more HBLs 160 formed at the side 30, the logic wafer T2 includes one or more HBLs 170 formed at the side 40 and one or more HBLs 180 formed at the side 60, and the logic wafer T3 includes one or more HBLs 190 formed at the side 70. The one or more HBLs 160 of the sensor wafer T1 are bonded with the one or more HBLs 170 of the logic wafer T2, and the one or more HBLs 180 of the logic wafer T2 are bonded with the one or more HBLs 190 of the logic wafer T3.

The sensor wafer T1 includes a substrate 200, the logic wafer T2 includes a substrate 210, and the logic wafer T3 includes a substrate 220. As discussed above, the substrates 200-220 may each include a semiconductor substrate, for example, a silicon substrate doped either with a P-type dopant or with an N-type dopant. Further, the substrate 200, 210, or 220 may each include an epitaxial layer (epi layer), or may be strained for performance enhancement.

Electrical circuitry or other microelectronic components may be formed in the substrates 200-220. For example, photo-sensitive elements such as photodiodes may be formed as parts of pixels 225 in the substrate 200. The photodiodes may be configured to sense or detect light or radiation waves that enter the substrate 200 from the side 20. The pixels 225 (containing the photodiodes) may collectively form a pixel grid array. Color filters and micro-lenses may be formed over each of the pixels to help filter out light of undesired wavelengths (e.g., corresponding to various colors) and to focus the light of desired colors. In that regard, the color filters can support the filtering of radiation waves having different wavelengths, which may correspond to different colors, such as primary colors including red, green, and blue, or complementary colors including cyan, yellow, and magenta. The color filters may also be positioned such that the desired incident light radiation is directed thereon and therethrough. For example, the color filter may filter the incident radiation such that only red light reaches the photodiode or another suitable radiation-sensing element. The color filters may include a dye-based (or pigment based) polymer or resin to achieve the filtering of specific wavelength bands.

After the color filters are formed, micro-lenses are formed over the color filters. The micro-lenses help direct radiation toward the photodiodes or other suitable radiation-sensing elements. The micro-lenses may be positioned in various arrangements and have various shapes depending on a refractive index of material used for the micro-lenses and distance from the surface of the substrate 200. In an embodiment, the micro-lenses each include an organic material, for example a photoresist material, or a polymer material. The micro-lenses are formed by one or more photolithography processes.

In addition to the pixels, transistors 230 may be formed at least partially in the substrate 200, transistors 240 may be formed at least partially in the substrate 210, and transistors 245 may be formed at least partially in the substrate 220. In some embodiments, the transistors 230 may include transfer transistors. Each transfer transistor 230 has a transfer gate formed between the photo-sensitive elements (e.g., a photodiode, not illustrated in FIGS. 5-6 for reasons of simplicity) and a floating diffusion region. The transfer gate may be used to transfer the accumulated charge from the photo-sensitive elements to the floating diffusion region. In some embodiments, the transistors 230 may be considered as a part of the pixels 225 as well.

Meanwhile, the transistors 240-245 may be parts of electrical circuitry configured to operate the pixels of the sensor wafer T1. For example, the transistors 240-245 may be portions of decoders, registers, multiplexers/de-multiplexers, amplifiers, read-out transistors, reference pixels, application specific integrated circuit (ASIC), etc. The transistors 240-245 may control or otherwise interact with the circuitry of the pixels 225, as well as the transfer transistor 230.

According to various aspects of the present disclosure, a protection diode 250 is also implemented in the CIS 10. In the embodiment shown in FIGS. 5-6, the protection diode 250 is implemented in the logic wafer T2, but it is understood that the protection diode 250 (or other instances thereof) may be implemented in the sensor wafer T1 or the logic wafer T3 in other embodiments. The protection diode 250 includes a plurality of differently doped regions. For example, as illustrated in detail with reference to FIG. 6, the protection diode 250 includes a doped region 260 that is disposed within the substrate 210, a doped region 270 that is disposed within the doped region 260, and a doped region 280 that is disposed within the doped region 270. The doped regions 260 and 280 may have the same type of conductivity, while the doped region 270 has a different type of conductivity than the doped regions 260 and 280. For example, in an embodiment where the substrate 210 is a P-type substrate, the doped regions 260 and 280 may be N-type doped regions, and the doped region 270 may be a P-type doped region.

In some embodiments, the doped region 260 includes a deep N-well (labeled herein as DNW) that contains a lightly-doped N-type material, and an N-well (labeled herein as NW) that contains an N-type material that has a greater dopant concentration level than the deep N-well, and a heavily doped N-type region (labeled herein as N+) that has an even greater dopant concentration level than both the deep N-well and the N-well. The heavily doped N-type region is shallower within the doped region 260 (e.g., having a smaller depth) than the N-well, which is shallower than the deep N-well. As such, the N-type dopant concentration level within the doped region 260 may increase as the depth therein gets shallower.

In some embodiments, the doped region 270 includes a P-well (labeled herein as PW) that contains a doped P-type material, and a heavily doped P-type region (labeled herein as P+) that contains a heavily doped P-type material that is more doped than the P-well. The heavily doped P-type region is shallower within the doped region 270 (e.g., having a smaller depth) than the P-well. As such, the P-type dopant concentration level within the doped region 270 may increase as the depth therein gets shallower as well.

In some embodiments, the doped region 280 includes a heavily doped N-type region (labeled herein as N+ again). The dopant concentration levels of the doped region 280, the heavily doped P-type region (i.e., the P+) of the doped region 270, and the heavily doped N-type region (i.e., the N+) of the doped region 260 may be on par with one another. For example, these dopant concentration levels may be within a range between about $10^{10}/cm^2$ and about $10^{16}/cm^2$. Meanwhile, the dopant concentration level P-well of the doped region 270 and the N-well of the doped region 260 may be within a range between about $10^{10}/cm^2$ and about $10^{16}/cm^2$, and the dopant concentration level of the deep N-well of the doped region 260 may be within a range between about $10^{10}/cm^2$ and about $10^{13}/cm^2$. These ranges are not randomly chosen but specifically configured such that the doped regions 260-280 will help to protect the CIS from plasma damage, as well as to keep the appropriate electrical biases to prevent damage to the microelectronic components of the CIS 10.

For example, as discussed above with reference to FIG. 2, the formation of the CIS 10 includes forming TSVs 300 (labeled herein as BTSV) in the logic wafer T2. The TSVs 300 each extend vertically through the substrate 210 of the logic wafer T2 in the Z-direction. To form such TSVs 300, one or more etching processes may be performed to etch openings in the substrate 210, and then performing metal deposition processes to fill these openings with a conductive material (e.g., copper, aluminum, tungsten, cobalt, ruthenium, or combinations thereof). The one or more etching or metal deposition processes may involve the application of plasma. Unfortunately, the electrical charges associated with ambient plasma may have an adverse impact on various microelectronic components of the CIS 10. For example, the sensor wafer T1 may include an interconnect structure 310 formed over the substrate 200, and the logic wafer T2 may include an interconnect structure 320 formed over the substrate 210 and that is bonded to the interconnect structure 310 (e.g., through the HBLs 160 and 170). Each of the interconnect structures 310 and 320 may include multiple metal layers containing metal lines, which are electrically interconnected by conductive vias or contacts. These metallization features of the interconnect structures 310 and 320 may be vulnerable to damage caused by the plasma charge generated by the etching or deposition processes performed as a part of the formation of the TSVs 300. If left unabated, the damaged metallization features may degrade the performance and/or lower the yield of the CIS 10.

To overcome the problem discussed above, the present disclosure uses the protection diode 250 to release or otherwise diffuse the plasma charges. For example, the doped regions 260, 270, and 280 of the protection diode 250 are each electrically coupled to the interconnect structure 320 (and by extension, to the interconnect structure 310) through respective vias and metal lines. The doped regions 260, 270, and/or 280 can help release the charges that would otherwise accumulate on the metallization features (e.g., metal lines, vias, and contacts) of the interconnect structures 320 and 310. As such, the metallization features are unlikely to be damaged by the plasma charges generated during the formation of the TSVs 300. In turn, the performance and/or yield of the CIS 10 may be improved. Such an advantage is an inherent result of implementing the protection diode 250 on the logic wafer T2 (or on the sensor wafer T1) before the plasma-related processes are performed.

The protection diode 250 also protects various microelectronic components of the CIS 10 during an electrical operation of the CIS 10. For example, the transfer transistor 230 may operate within a voltage range between about −M volts (V) and about N volts, where M and N are integers, respectively. For example, in an embodiment, M=1.2, and N=3, which means that the voltage of the transfer transistor 230 may swing between about −1.2 V and about 3 V during an electrical operation of the CIS 10. The transfer transistor 230 is electrically coupled to the substrate 210, which is considered electrical ground. When the transfer transistor 230 swings to a sufficiently negative voltage, it could pull the substrate 210 down to a negative voltage as well. This would be undesirable, since the proper electrical biases of the various circuitries (for their intended electrical operations) on the logic wafer T2 assume that the substrate 210 is at electrical ground, rather than a negative voltage. As such, having the substrate 210 pulled to a negative voltage may adversely interfere with the proper electrical operations of the CIS 10.

Here, the present disclosure electrically couples the protection diode 250 to the transfer transistor 230 in a manner to prevent the above problem (e.g., the substrate 210 being pulled to a negative voltage) from occurring. For example, the doped region 260 is electrically biased to a first reference voltage (e.g., through a conductive via and a metal line of the interconnect structure 320), the doped region 270 is electrically biased to a second reference voltage (e.g., through another conductive via and a metal line of the interconnect structure 320), and the doped region 280 of the protection diode 250 is electrically coupled to the gate of the transfer transistor 230 through the conductive vias and metal lines of the interconnect structures 320 and 310.

In the illustrated embodiment, the first reference voltage is a positive voltage, and the second reference voltage is a negative voltage that is more negative than the negative voltage of the transistor 230. For example, the first reference voltage may be about 2.8 V, and the second reference voltage may be about −2 V, which are common voltage references for other circuitries in the logic wafer T2. Since the transistor 230 may swing down to a negative voltage of −1.2 V (where M=1.2) at most (e.g., at the bottom limit of its negative voltage range), the second reference voltage is more negative than even the most negative voltage value of the transfer transistor 230 (e.g., −2 V is more negative than −1.2 V). Such an electrical biasing scheme can effectively prevent the substrate 210 being pulled to an undesirable negative voltage. For example, since the doped region 270 surrounds the doped region 280 in a cross-sectional view, it forms a P/N junction with the doped region 280. When the transfer transistor swings to −1.2 V (i.e., its most negative voltage), the doped region 280 may be pulled to this negative voltage of −1.2 V. However, the doped region 270 is tied to −2 V, which is a more negative voltage than the −1.2 V at the doped region 280. This means that the P/N junction formed by the doped regions 270 and 280 is still reversed biased, which results in very little, if any, electrical current flow. Accordingly, the substrate 210 is substantially unaffected (i.e., not being pulled down to the negative voltage of −1.2 V of the transfer transistor 230) throughout the voltage swing of the transfer transistor 230.

Note that had the doped region 270 been biased to a reference voltage greater than the voltage of the transfer transistor (e.g., the second reference voltage being 0 V rather than −2 V), then the reverse bias condition may not have been achieved, which could not have prevented the negative voltage of the transfer transistor from pulling the substrate 210 down to the negative voltage. Therefore, the present disclosure utilizes not just the unique device configurations, but also novel electrical biasing schemes, to achieve various operational benefits for the CIS 10. These operational benefits (e.g., isolating the substrate 210 from undesirable voltage variations) are inherent results of implementing the protection diode 250 with the specific configuration of the doped regions 260-280 and with the application of the specific reference voltages.

Another unique physical characteristic of the present disclosure is that the doped region 260—as a part of the protection diode 250—is formed to surround the doped region 270 in the cross-sectional view. Had the doped region 260 not been formed, then the doped region 270 would have come into direct physical contact with the substrate 210. This means that the substrate 210 could have been pulled to whatever voltage the second reference voltage is, which is −2 V in this case. As discussed above, the proper functioning of many microelectronic components on the CIS 10 needs the substrate 210 to be set to electrical ground. The negative voltage of the substrate 210 due to a direct connection with the second reference voltage is therefore undesirable as well.

Here, the implementation of the doped region 260 to surround the doped region 270 serves as an isolation barrier against the second reference voltage. Specifically, the P-type doped region 270 forms another P/N junction with the N-type doped region 260. Since the N-type doped region 260 is biased to a positive first reference voltage (e.g., 2.8 V in this case) while the P-type doped region 270 is biased to a negative second reference voltage (e.g., −1.2 V in this case), this P/N junction is still reverse biased, meaning very little to no electrical current will flow as a result. As such, the substrate 210 is unaffected by the negative second reference voltage to which the doped region 270 is biased. Furthermore, the substrate 210 itself may be a P-type substrate, and since it surrounds the N-type doped region 260, the substrate 210 forms another P/N junction with the N-type doped region 260. This P/N junction itself is also reversed biased due to the fact that the P-type substrate is at electrical ground (0 volts) while the N-type doped region 260 is biased to a positive voltage (e.g., 2.8 V herein). Such a reversed biased P/N junction further cuts off any potential current flow between the substrate 210 and the source of the second reference voltage. Accordingly, the substrate 210 is further insulated from other potential electrical interferences and may still properly serve as an electrical ground.

It is understood that the specific values of the first reference voltage and/or the second reference voltage discussed above are not intended to be limiting unless specifically claimed otherwise. For example, rather than having 2.8 V as its first reference voltage, other values of 2.5 V, 3 V, or 3.3 V may be used. As another example, rather than having −2 V as its second reference voltage, other values of −2.5 V, −3 V, or −3.3 V may be used as well.

Figure 7:
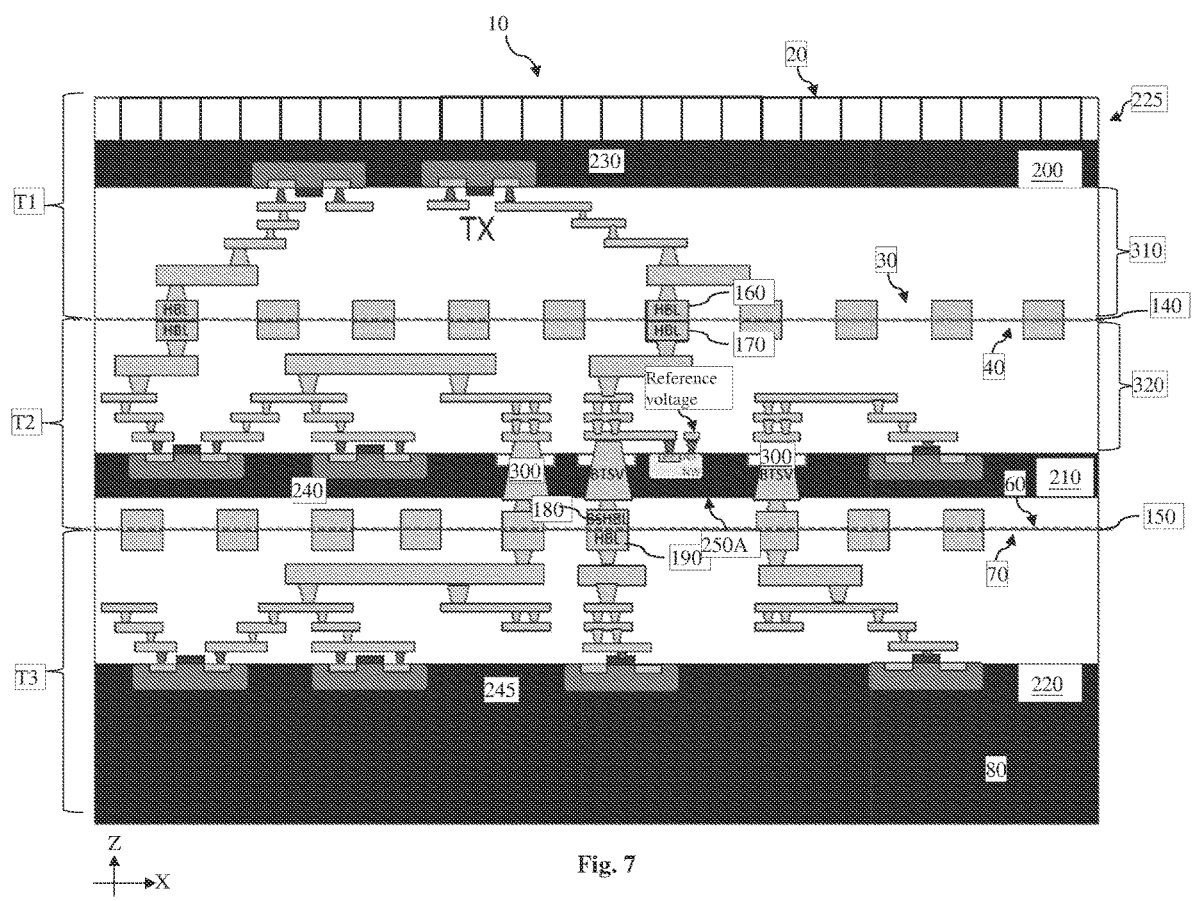
Figure 8:
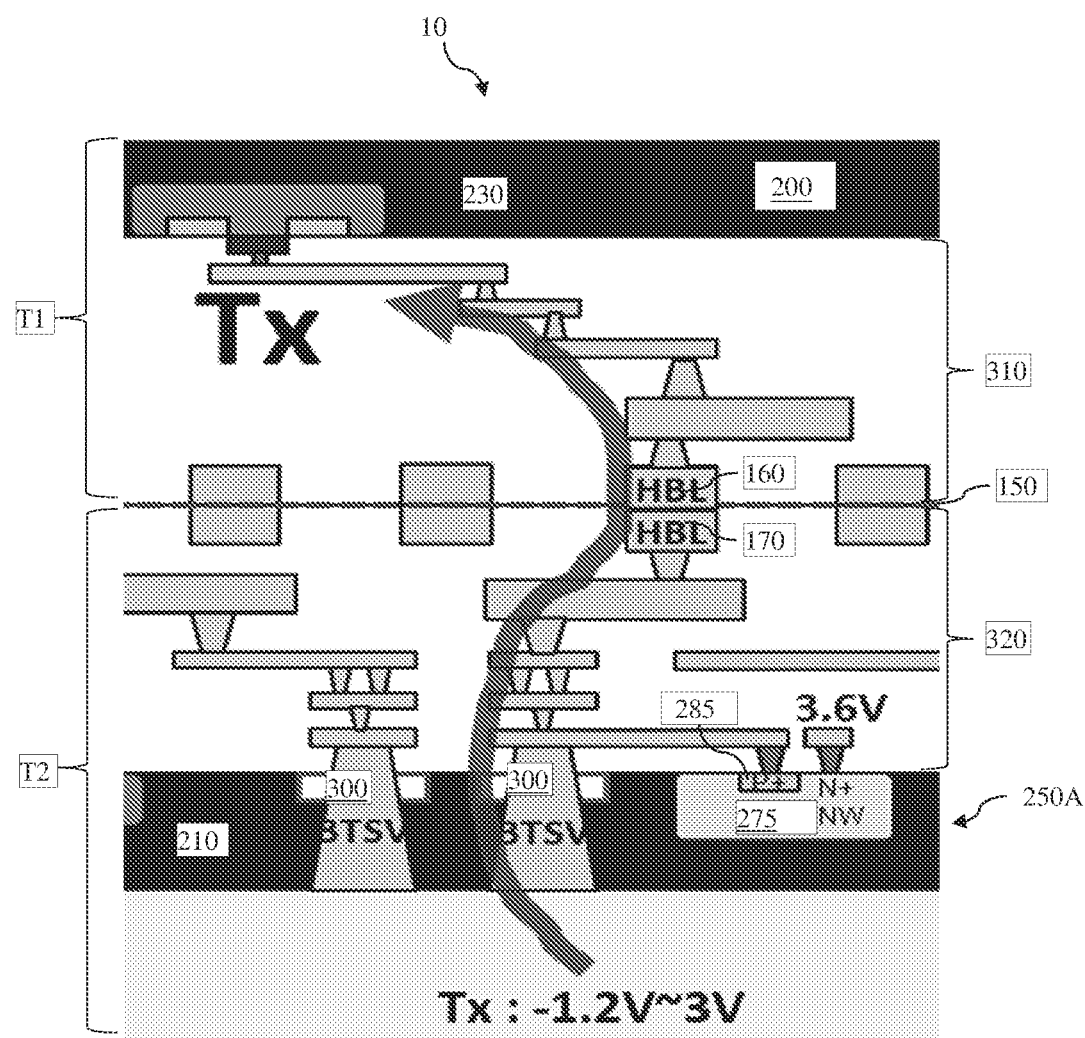

FIGS. 7-8 are diagrammatic fragmentary cross-sectional side views of the CIS 10 according to another embodiment of the present disclosure. In more detail, FIG. 7 illustrates the details of the CIS 10 as a stacked structure of three wafers that are bonded together: the sensor wafer T1, the logic wafer T2, and the logic wafer T3, and FIG. 8 illustrates a magnified view of a portion of the CIS 10. For reasons of consistency and clarity, similar components appearing in the embodiment of FIGS. 7-8 are labeled the same as those that appear in the embodiment of FIGS. 5-6.

Referring to FIGS. 7-8, the sensor wafer T1 is bonded to the logic wafer T2 through the bonding interface 140, and the logic wafer T2 is bonded to the logic wafer T3 through the bonding interface 150, for example, through the HBLs 160-190. As was the case in the embodiment of FIGS. 5-6, light-detecting pixels and one or more transistors 230 may be formed at least partially in the substrate 200, and other transistors 240 and 245 may be formed at least partially in the substrate 210 and in the substrate 220, respectively.

According to various aspects of the present disclosure, a protection diode 250A is implemented in the CIS 10. In the embodiment shown in FIGS. 7-8, the protection diode 250A is implemented in the logic wafer T2, but it is understood that the protection diode 250A (or other instances thereof) may be implemented in the sensor wafer T1 or the logic wafer T3 in other embodiments. Similar to the protection diode 250 of the embodiment corresponding to FIGS. 5-6, the protection diode 250A of the embodiment of FIGS. 7-8 includes a plurality of differently doped regions to protect the CIS 10 during its fabrication and operation. However, whereas the protection diode 250 includes three doped regions 260, 270, and 280, the protection diode 250A includes two doped regions 275 and 285. The doped region 275 is an N-type doped region embedded in the substrate 210, and the doped region 285 is a P-type doped region embedded in the doped region 275. In some embodiments, the doped region 275 includes a lightly doped N-well and a heavily doped N-type portion that is located at or near the surface of the substrate 210, and the doped region 285 includes a heavily doped P-type portion that is located at or near the surface of the substrate 210. The doped region 285 is surrounded (other than its upper surface) by the doped region 275 in the cross-sectional view. The doped region 285 is electrically tied to the gate of the transfer transistor 230 through the metal lines and vias of the interconnect structures 310 and 320. The doped region 275 is electrically tied to a positive reference voltage, which is 3.6 V in this case.

Although the structures and the applied voltage references are different between the protection diode 250 of FIGS. 5-6 and the protection diode 250A of FIGS. 7-8, the protection diode 250A is still configured to keep its P/N junctions (e.g., a P/N junction formed by the doped regions 285/275 and another P/N junction formed by the substrate 210 and the doped region 275) in reverse bias, regardless of the extent of the swing of the voltage of the transfer transistor 230. That is, as the voltage of the transfer transistor 230 swings between −1.2 V and 3 V, the protection diode 250A still keeps the substrate 210 from being pulled down to a negative voltage value of the transfer transistor 230. Furthermore, the protection diode 250A also protects the CIS 10 during its fabrication, for example, during the etching processes used to form the TSVs 300 of the logic wafer T2. Similar to the protection diode 250 discussed above, the protection diode 250A can help release the plasma charges accumulated as a result of the etching or deposition processes (which use plasma), and as such, the components of the CIS 10 are unlikely to become damaged during the fabrication of the CIS 10.

Figure 9:
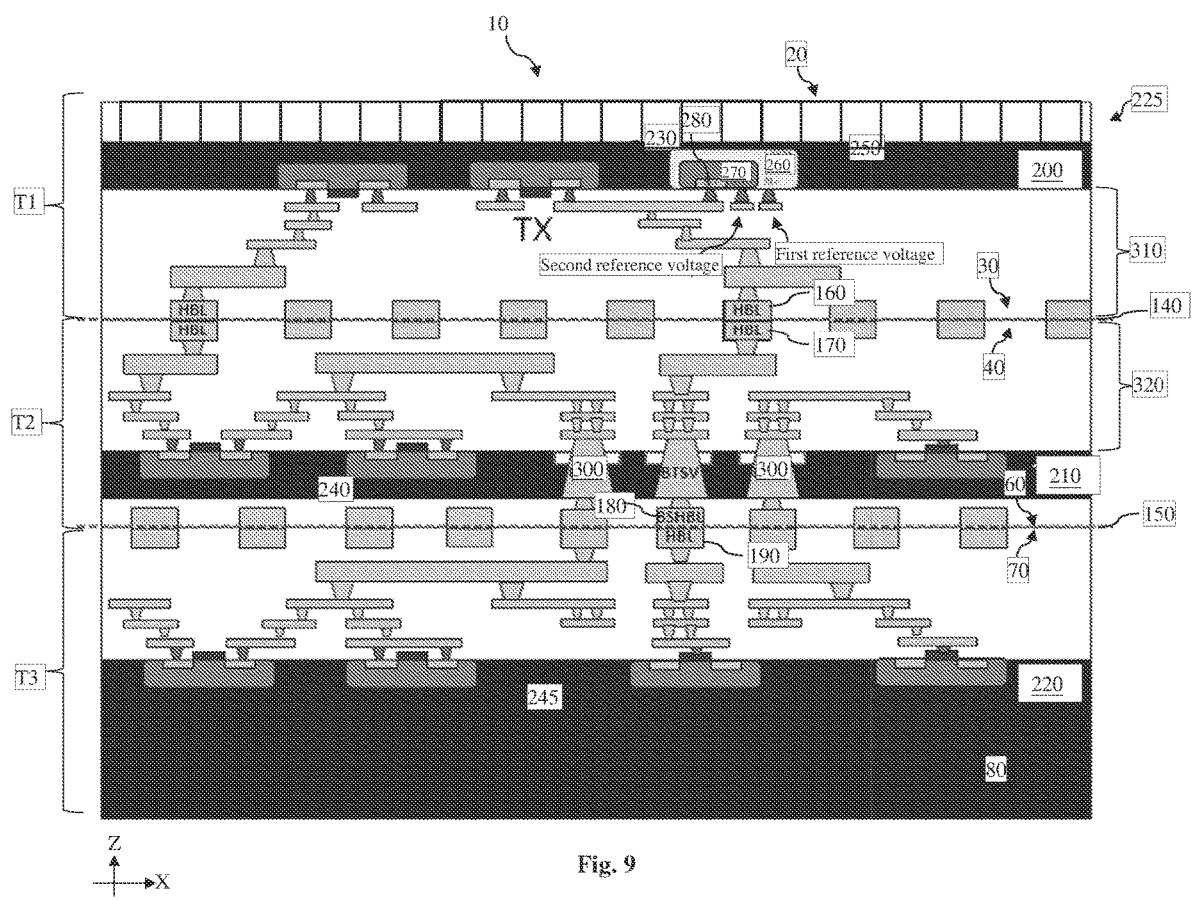

FIG. 9 is a diagrammatic fragmentary cross-sectional side view of the CIS 10 according to yet another embodiment of the present disclosure. Again, for reasons of consistency and clarity, similar components appearing in the embodiment of FIG. 9 are labeled the same as those that appear in the embodiments of FIGS. 5-8.

In the embodiment of FIG. 9, the sensor wafer T1 is still bonded to the logic wafer T2 through the bonding interface 140, and the logic wafer T2 is still bonded to the logic wafer T3 through the bonding interface 150, for example, through the HBLs 160-190. As was the case in the embodiment of FIGS. 5-8, light-detecting pixels and one or more transistors 230 may be formed at least partially in the substrate 200, and other transistors 240 and 245 may be formed at least partially in the substrate 210 and in the substrate 220, respectively.

Unlike the embodiments of FIGS. 5-8, however, the embodiment of FIG. 9 implements the protection diode 250 in the sensor wafer T1. The protection diode 250 includes the doped region 260 embedded in the substrate 200, the doped region 270 embedded in the doped region 260, and the doped region 280 embedded in the P-type doped region 270. As is the case in the embodiment of FIGS. 5-6, the doped regions 260 and 280 are doped with N-type dopants, and the doped region 270 is doped with a P-type dopant. The doped regions 260 and 270 are electrically tied to the first reference voltage (e.g., 2.8 V) and the second reference voltage (e.g., −2 V), respectively, through vias and metal lines of the interconnect structure 310. The doped region 280 is electrically tied to the gate of the transfer transistor 230 through the vias and metal lines of the interconnect structure 310. Again, other voltage reference values discussed above in association with the embodiment of FIGS. 5-6 may be used here as well.

Similar to the protection diode 250 of the embodiment of FIGS. 5-6, the protection diode 250 herein forms P/N junctions with the substrate 200 and the doped region 260, the doped region 270 and the doped region 260, and the doped region 270 and the doped region 280. And similar to the protection diode 250 of the embodiment of FIGS. 5-6, the structural configurations and the electrical biases of the protection diode 250 herein also help keep the P/N junctions in reverse bias, regardless of the swings of the voltage of the transfer transistor 230. In other words, the protection diode 250 helps insulate the substrate 210 from being pulled down to a negative voltage by the transfer transistor 230. Furthermore, the protection diode 250 also protects the CIS 10 during its fabrication, for example, during the etching or deposition processes used to form the TSVs 300 of the logic wafer T2. Similar to the protection diode 250 of FIGS. 5-6 discussed above, the protection diode 250 herein can help release the plasma charges accumulated as a result of the etching or deposition processes (which use plasma), and as such, the components of the CIS 10 are unlikely to become damaged during the fabrication of the CIS 10.

Figure 10:
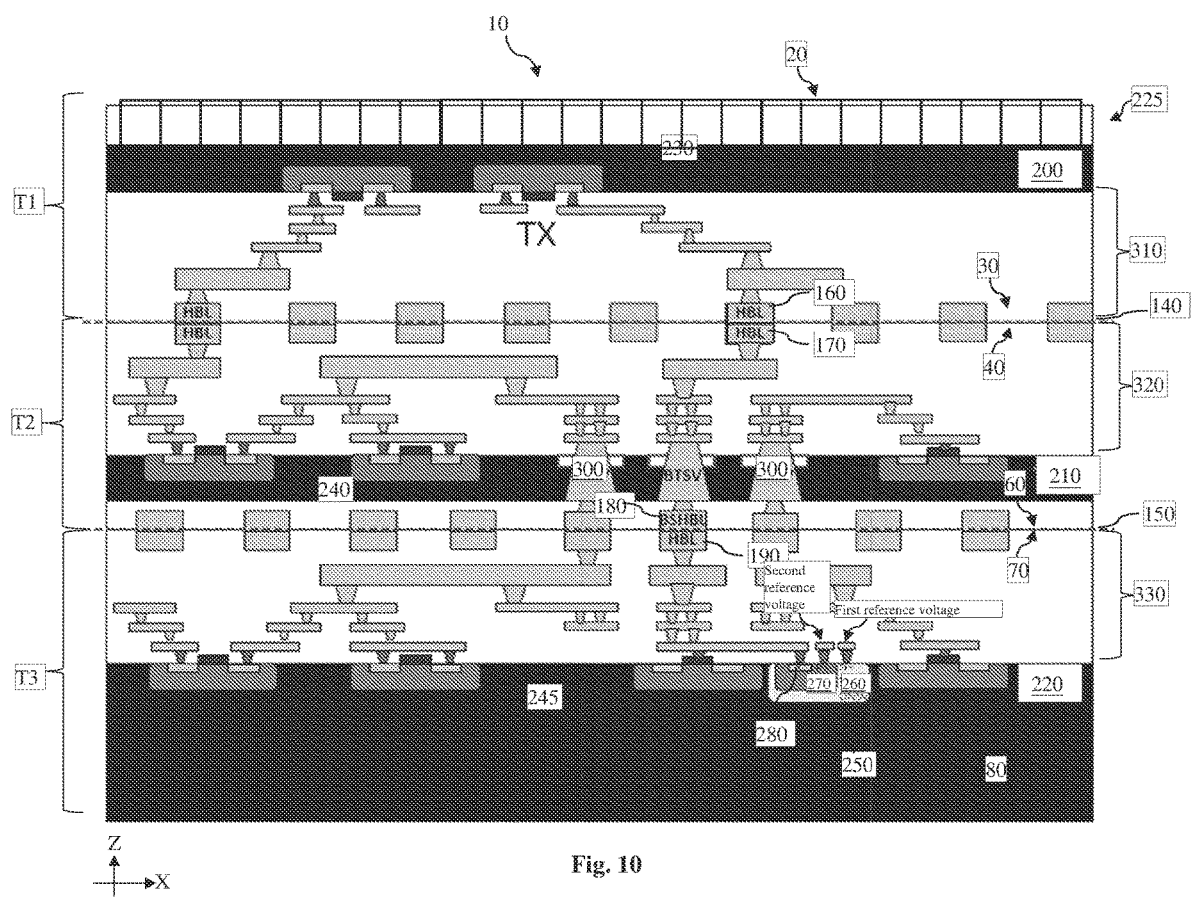

FIG. 10 is a diagrammatic fragmentary cross-sectional side view of the CIS 10 according to yet another embodiment of the present disclosure. Again, for reasons of consistency and clarity, similar components appearing in the embodiment of FIG. 10 are labeled the same as those that appear in the embodiments of FIGS. 5-9.

In the embodiment of FIG. 10, the sensor wafer T1 is still bonded to the logic wafer T2 through the bonding interface 140, and the logic wafer T2 is still bonded to the logic wafer T3 through the bonding interface 150, for example, through the HBLs 160-190. As was the case in the embodiment of FIGS. 5-9, light-detecting pixels and one or more transistors 230 may be formed at least partially in the substrate 200, and other transistors 240 and 245 may be formed at least partially in the substrate 210 and in the substrate 220, respectively.

Unlike the embodiments of FIGS. 5-9, however, the embodiment of FIG. 10 implements the protection diode 250 in the logic wafer T3. The protection diode 250 includes the doped region 260 embedded in the substrate 220, the doped region 270 embedded in the doped region 260, and the doped region 280 embedded in the doped region 270. As is the case in the embodiment of FIGS. 5-6, the doped regions 260 and 280 are doped with N-type dopants, and the doped region 270 is doped with a P-type dopant. The doped regions 260 and 270 are electrically tied to the first reference voltage (e.g., 2.8 V) and the second reference voltage (e.g., −2 V), respectively, through the vias and metal lines of an interconnect 330 of the logic wafer T3. The doped region 280 is electrically tied to the gate of the transfer transistor 230 through the vias and metal lines of the interconnect structures 310-330. Again, other voltage reference values discussed above in association with the embodiment of FIGS. 5-6 may be used here as well.

Similar to the protection diode 250 of the embodiment of FIGS. 5-6, the protection diode 250 herein forms P/N junctions with the substrate 220 and the doped region 260, the doped region 270 and the doped region 260, and the doped region 270 and the doped region 280. And similar to the protection diode 250 of the embodiment of FIGS. 5-6, the structural configurations and the electrical biases of the protection diode 250 herein also help keep the P/N junctions in reverse bias, regardless of the swings of the voltage of the transfer transistor 230. In other words, the protection diode 250 helps insulate the substrate 210 from being pulled down to a negative voltage by the transfer transistor 230.

Figure 11:
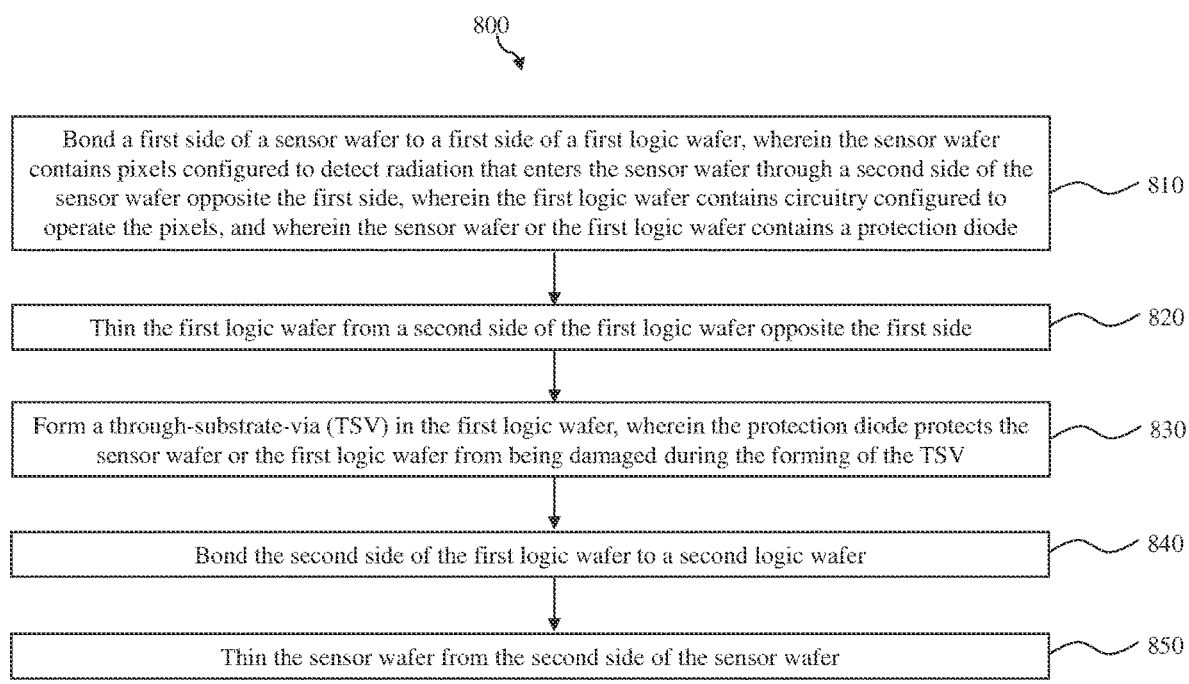
FIG. 11 illustrates a flowchart illustrating a method according to various aspects of the present disclosure.

FIG. 11 is a flowchart illustrating a method 800 of fabricating an image sensor device according to embodiments of the present disclosure. The method 800 includes a step 810 to bond a first side of a sensor wafer to a first side of a first logic wafer. The sensor wafer contains pixels configured to detect radiation that enters the sensor wafer through a second side of the sensor wafer opposite the first side. The first logic wafer contains circuitry configured to operate the pixels. The sensor wafer or the first logic wafer contains a protection diode.

The method 800 includes a step 820 to thin the first logic wafer from a second side of the first logic wafer opposite the first side.

The method 800 includes a step 830 to form a through-substrate-via (TSV) in the first logic wafer. The protection diode protects the sensor wafer or the first logic wafer from being damaged during the forming of the TSV.

The method 800 includes a step 840 to bond the second side of the first logic wafer to a second logic wafer.

The method 800 includes a step 850 to thin the sensor wafer from the second side of the sensor wafer.

In some embodiments, the step 830 to form the TSV includes performing one or more etching or deposition processes in which plasma is used. The protection diode protects the sensor wafer or the first logic wafer from being damaged by the plasma.

In some embodiments, before the step 810 to bond the first side of the sensor wafer to the first side of the first logic wafer, the protection diode is formed in the sensor wafer or in the first logic wafer at least in part by: forming a first doped region in a substrate of the sensor wafer or in a substrate of the first logic wafer; forming a second doped region in the first doped region, wherein the second doped region has a different type of conductivity than the first doped region; and forming a third doped region in the second doped region, wherein the third doped region has a same type of conductivity as the first doped region.

In some embodiments, the sensor wafer contains a transfer gate.

It is understood that the method 800 may include further steps performed before, during, or after the steps 810-850. For example, the method 800 may include a step of electrically biasing the first doped region a first reference voltage, as well as a step of electrically biasing the second doped region to a second reference voltage different from the first reference voltage. One of the first reference voltage and the second reference voltage is a positive voltage, while another one of the first reference voltage and the second reference voltage is a negative voltage. As another example, the method 800 may include a step of electrically tying the third doped region to the transfer gate. As yet another example, the method 800 may include a step of electrically operating the image sensor device. The protection diode protects the image sensor device during an electrical operation of the image sensor device. The image sensor device may be operated by applying a voltage between −M volts and N volts to the transfer gate. The second reference voltage is a more negative voltage than −M volts. Other steps of the method 800 may include steps of forming color filters and micro-lenses. For reasons of simplicity, these additional steps are not discussed herein in detail.

Figure 12:
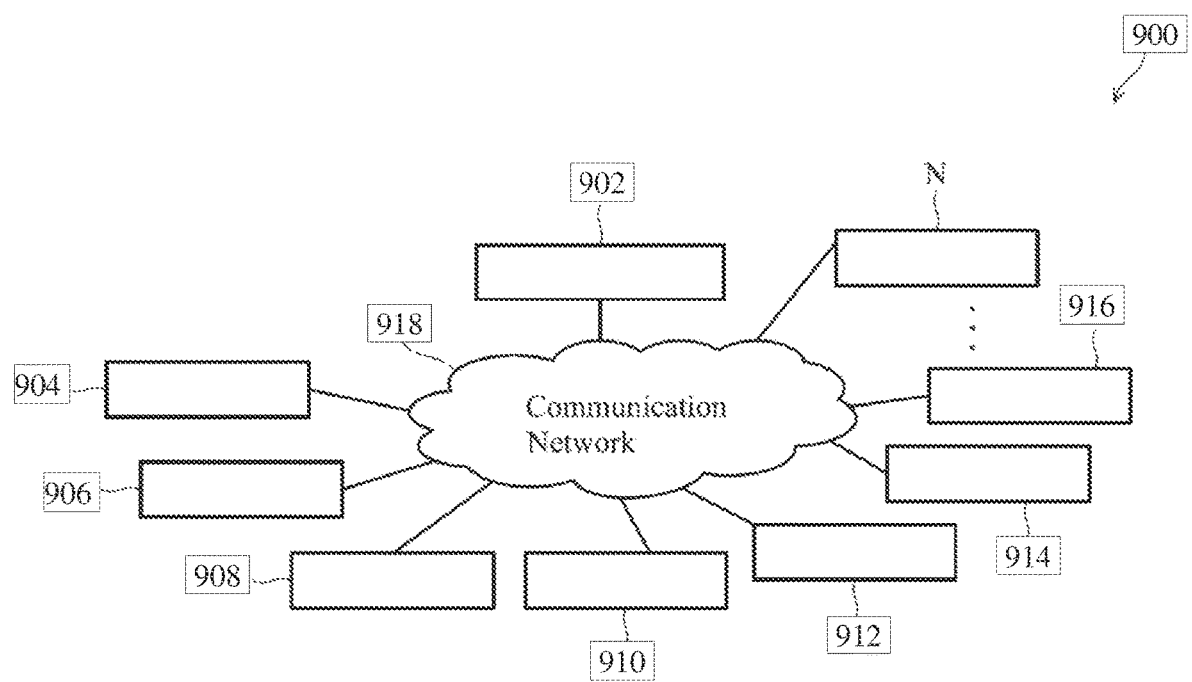
FIG. 12 illustrates a block diagram of an integrated circuit fabrication system according to various aspects of the present disclosure.

FIG. 12 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

The advanced lithography process, method, and materials described above can be used in many applications, including applications where the transistors are implemented as fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the transistors may also be implemented using multi-channel devices such as Gate-All-Around (GAA) devices. To the extent that the present disclosure refers to a fin structure or FinFET devices, such discussions may apply equally to the GAA devices.

The present disclosure may offer advantages over conventional devices. However, it is understood that not all advantages are discussed herein, different embodiments may offer different advantages, and that no particular advantage is required for any embodiment. One advantage is the protection of the CIS device during its fabrication. As discussed above, the fabrication of the CIS device may include performing one or more processes involving the use of plasma, for example, etching processes used to etch an opening for a through-substrate via, metal deposition processes to fill the etched opening, or ashing processes. The plasma from these processes, when exposed to various components of the CIS device (e.g., metallization features), could damage the CIS device. By implementing a protection diode in a sensor wafer or in a logic wafer bonded to the sensor wafer, the plasma can be released or otherwise diffused by the protection diode, thereby reducing the likelihood of the plasma causing any damage to the CIS device. Such an advantage is an inherent result of implementing the protection diode on the appropriate wafers before the plasma processes are performed.

Another advantage is the protection of the CIS device during its operation. As discussed above, some of the circuitry, such as the transfer transistor of the sensor wafer, may swing between a negative voltage and a positive range. When the transfer transistor swings to a negative voltage, it could pull the substrate of the logic wafer down to the negative voltage as well, which is undesirable, since the intended operation of the circuitry on the logic wafer presume that the substrate is at electrical ground. Here, by electrically connecting the various doped regions of the protection diode to the transfer transistor, and to predefined voltage references, the P/N junctions of the protection diode are kept at reverse bias, which prevents current flow and therefore reduces the likelihood of the substrate of the logic wafer being pulled down to any negative voltage of the transfer transistor. Such an advantage is another inherent result of the unique structural configurations of the protection diode and the specific biasing schemes applied thereto. Other advantages may include compatibility with existing fabrication processes and the ease and low cost of implementation.

One aspect of the present disclosure pertains to an image sensor device. The image sensor device includes a first substrate that includes a plurality of pixels and at least a transistor. The image sensor device includes a second substrate bonded to the first substrate, the second substrate including circuitry for interacting with the pixels. The image sensor device includes a protection diode disposed within the first substrate or within the second substrate. The protection diode includes: a first doped region, a second doped region disposed within the first doped region, and a third doped region disposed within the second doped region. The first doped region and the third doped region have a same type of conductivity. The second doped region has a different type of conductivity than the first doped region and the third doped region. The third doped region is electrically coupled to the transistor of the first substrate.

Another aspect of the present disclosure pertains to an image sensor device. The image sensor device includes a sensor substrate, the sensor substrate including a plurality of pixels and a transfer gate. The pixels are configured to detect radiation that enters the sensor substrate through a back side of the sensor substrate. The image sensor device includes a first non-sensor substrate bonded to the sensor substrate through a front side of the sensor substrate, the first non-sensor substrate including circuitry configured to operate the pixels. The image sensor device includes a second non-sensor substrate bonded to the first non-sensor substrate such that the first non-sensor substrate is bonded between the sensor substrate and the second non-sensor substrate, the first non-sensor substrate including further circuitry configured to operate the pixels. The image sensor device includes one or more protection diodes implemented in the sensor substrate, in the first non-sensor substrate, or in the second non-sensor substrate. Each of the one or more protection diodes includes: a first doped well, a second doped well located within the first doped well, and a third doped well located within the second doped well. The second doped well has a different type of conductivity than the first doped well and the third doped well. The first doped well is electrically tied to a first reference voltage. The second doped well is electrically tied to a second reference voltage different from the first reference voltage. The third doped well is electrically tied to the transfer gate.

Yet another aspect of the present disclosure pertains to a method. A first side of a sensor wafer is bonded to a first side of a first logic wafer. The sensor wafer contains pixels configured to detect radiation that enters the sensor wafer through a second side of the sensor wafer opposite the first side. The first logic wafer contains circuitry configured to operate the pixels. The sensor wafer or the first logic wafer contains a protection diode. The first logic wafer is thinned from a second side of the first logic wafer opposite the first side. A through-substrate-via (TSV) is formed in the first logic wafer. The protection diode protects the sensor wafer or the first logic wafer from being damaged during the forming of the TSV. The second side of the first logic wafer is bonded to a second logic wafer. The sensor wafer is thinned from the second side of the sensor wafer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
   a first substrate that includes a plurality of pixels and at least a transistor;
   a second substrate bonded to the first substrate, the second substrate including circuitry for interacting with the plurality of pixels; and
   a protection diode disposed within the first substrate or within the second substrate, the protection diode including: a first doped region, a second doped region disposed within the first doped region, and a third doped region disposed within the second doped region;
   wherein:
   the first doped region and the third doped region have a same type of conductivity;
   the second doped region has a different type of conductivity than the first doped region and the third doped region; and
   the third doped region is electrically coupled to the transistor of the first substrate.

2. The image sensor device of claim 1, wherein:
the first doped region is electrically coupled to a first reference voltage; and
the second doped region is electrically coupled to a second reference voltage different from the first reference voltage.

3. The image sensor device of claim 2, wherein the first reference voltage is a positive voltage, and the second reference voltage is a negative voltage.

4. The image sensor device of claim 3, wherein:
a voltage associated with the transistor swings from −M volts to N volts when the image sensor device is in operation; and
the negative voltage of the second reference voltage is more negative than −M volts.

5. The image sensor device of claim 1, wherein: the transistor includes a transfer gate.

6. The image sensor device of claim 1, wherein:
the protection diode is implemented within the first substrate but not in the second substrate; or
the protection diode is implemented within the second substrate but not in the first substrate.

7. The image sensor device of claim 1, wherein:
the first substrate includes a first surface and a second surface opposite the first surface;
the plurality of pixels are configured to detect light that enters the first substrate from the first surface; and
the second substrate is bonded to the second surface of the first substrate.

8. The image sensor device of claim 1, further comprising a third substrate bonded to the second substrate.

9. The image sensor device of claim 8, wherein:
the first substrate is a part of a sensor wafer;
the second substrate is a part of a first logic wafer;
the third substrate is a part of a second logic wafer;
a first surface of the first logic wafer is bonded to the second logic wafer; and
a second surface of the first logic wafer is bonded to the sensor wafer.

10. The image sensor device of claim 1, wherein: the first doped region, the second doped region, and the third doped region have substantially co-planar surfaces in a cross-sectional side view.

11. The image sensor device of claim 1, wherein a dopant concentration level of the third doped region is greater than a dopant concentration level of at least a portion of the first doped region.

12. An image sensor device, comprising:
a sensor substrate, the sensor substrate including a plurality of pixels and a transfer gate, wherein the plurality of pixels are configured to detect radiation that enters the sensor substrate through a back side of the sensor substrate;
a first non-sensor substrate bonded to the sensor substrate through a front side of the sensor substrate, the first non-sensor substrate including circuitry configured to operate the plurality of pixels;
a second non-sensor substrate bonded to the first non-sensor substrate such that the first non-sensor substrate is bonded between the sensor substrate and the second non-sensor substrate, the second non-sensor substrate including further circuitry configured to operate the plurality of pixels;
a protection diode implemented in the sensor substrate, in the first non-sensor substrate, or in the second non-sensor substrate;

wherein:
the protection diode includes: a first doped well, a second doped well located within the first doped well, and a third doped well located within the second doped well;
the second doped well has a different type of conductivity than the first doped well and the third doped well;
the first doped well is electrically tied to a first reference voltage;
the second doped well is electrically tied to a second reference voltage different from the first reference voltage; and
the third doped well is electrically tied to the transfer gate.

13. The image sensor device of claim 12, wherein:
the first reference voltage is a positive voltage;
the second reference voltage is a negative voltage; and
during an operation of the image sensor device, the transfer gate has a voltage in a range between −M volts and N volts, wherein −M volts is a less negative voltage than the second reference voltage.

14. The image sensor device of claim 12, wherein the first doped well, the second doped well, and the third doped well have substantially co-planar surfaces in a cross-sectional side view, and wherein a dopant concentration level of the third doped well is greater than a dopant concentration level of at least a portion of the first doped well.

15. An image sensor device, comprising: a first substrate that includes a plurality of radiation-sensing elements and at least a transistor, wherein the first substrate is a part of a first sensor device; a second substrate coupled to the first substrate, wherein the second substrate includes electrical circuitry configured to interact with the plurality of radiation-sensing elements, and wherein the second substrate is a part of a first logic device; a protection diode disposed in at least one of the first substrate or the second substrate, wherein the protection diode includes: a first doped region having a first type of conductivity, a second doped region having a second type of conductivity disposed within the first doped region, and a third doped region having the first type of conductivity disposed within the second doped region, wherein the third doped region is electrically coupled to the transistor of the first substrate; and a third substrate coupled to the second substrate.

16. The image sensor device of claim 15, wherein:
the first doped region is at a first reference voltage during an operation of the image sensor device; and
the second doped region is at a second reference voltage different from the first reference voltage during the operation of the image sensor device.

17. The image sensor device of claim 16, wherein the first reference voltage is greater than the second reference voltage.

18. The image sensor device of claim 15, wherein the transistor includes a transfer gate.

19. The image sensor device of claim 15, wherein:
the first substrate includes a first surface and a second surface opposite the first surface;
the plurality of radiation-sensing elements are configured to sense radiation that enters the first substrate from the first surface; and
the second substrate is coupled to the first substrate through the second surface.

20. The image sensor device of claim 15, wherein: the first doped region, the second doped region, and the third doped region have substantially co-planar surfaces in a cross-sectional side view, and wherein a dopant concentration level of the third doped region is greater than a dopant concentration level of at least a portion of the first doped region.

* * * * *